United States Patent
Nakayama et al.

(10) Patent No.: US 7,561,243 B2
(45) Date of Patent: Jul. 14, 2009

(54) LIQUID CRYSTAL DISPLAY DEVICE WITH SPACERS FACING CAPACITIVE ELEMENT

(75) Inventors: Takanori Nakayama, Mobara (JP); Ryuuta Watanabe, Mobara (JP); Jun Ooida, Mobara (JP); Yasuko Gotoh, Mobara (JP); Kaori Miyazaki, Mobara (JP)

(73) Assignee: Hitachi, Ltd., Tokyo (JP)

( * ) Notice: Subject to any disclaimer, the term of this patent is extended or adjusted under 35 U.S.C. 154(b) by 342 days.

(21) Appl. No.: 10/190,671

(22) Filed: Jul. 9, 2002

(65) Prior Publication Data

US 2003/0043307 A1 Mar. 6, 2003

(30) Foreign Application Priority Data

Aug. 30, 2001 (JP) .............................. 2001-261680

(51) Int. Cl.
 *G02F 1/1343* (2006.01)
 *G02F 1/1339* (2006.01)
(52) U.S. Cl. ............................. 349/155; 349/38; 349/39
(58) Field of Classification Search .................. 349/39, 349/38, 42, 43, 155, 156, 46, 44, 45
See application file for complete search history.

(56) References Cited

U.S. PATENT DOCUMENTS

| | | | | |
|---|---|---|---|---|
| 5,539,546 A | * | 7/1996 | Koden et al. .................. | 349/86 |
| 5,737,049 A | * | 4/1998 | Shin et al. .................... | 349/122 |
| 5,905,549 A | | 5/1999 | Lee | |
| 5,953,088 A | * | 9/1999 | Hanazawa et al. ........... | 349/110 |
| 5,959,706 A | * | 9/1999 | Nagata et al. ................ | 349/110 |
| 6,001,539 A | | 12/1999 | Lyu et al. ..................... | 430/317 |
| 6,028,650 A | | 2/2000 | Kuroha et al. ................. | 349/38 |
| 6,285,418 B1 | * | 9/2001 | Ko et al. ........................ | 349/38 |
| 6,411,346 B1 | * | 6/2002 | Numano et al. ............... | 349/39 |
| 6,507,385 B1 | | 1/2003 | Nishiyama et al. .......... | 349/156 |

(Continued)

FOREIGN PATENT DOCUMENTS

JP 2001-209070 1/2000

OTHER PUBLICATIONS

Chinese Patent Office Office Action dated Oct. 10, 2007, in Chinese.

*Primary Examiner*—David Nelms
*Assistant Examiner*—Hoan C Nguyen
(74) *Attorney, Agent, or Firm*—Reed Smith LLP; Stanley P. Fisher, Esq.; Juan Carlos A. Marquez, Esq.

(57) ABSTRACT

A liquid crystal display device comprises a pair of substrates which are arranged to face each other in an opposed manner while sandwiching liquid crystal therebetween, pixel regions which are formed on a liquid-crystal-side surface of one substrate out of the pair of substrates, and thin film transistors which are formed on respective pixel regions, wherein each thin film transistor includes a gate electrode connected to a gate signal line, a semiconductor layer laminated to the gate electrode by way of an insulation film, a drain electrode formed on the semiconductor layer and connected to a drain signal line, and a source electrode connected to a pixel electrode, and the semiconductor layer is formed in a periodically irregular shape in a zone having a width substantially larger than a width of the source electrode on a side thereof from which at least the source electrode is pulled out.

6 Claims, 15 Drawing Sheets

U.S. PATENT DOCUMENTS

| | | | |
|---|---|---|---|
| 6,529,257 B1 | 3/2003 | Nakano | 349/143 |
| 6,583,829 B2 * | 6/2003 | Ootsu et al. | 349/43 |
| 6,590,630 B2 * | 7/2003 | Kim | 349/192 |
| 6,839,099 B2 * | 1/2005 | Fukunishi | 349/54 |
| 7,098,970 B2 * | 8/2006 | Hidehira et al. | 349/44 |
| 2001/0019372 A1 * | 9/2001 | Ootsu et al. | 349/38 |

* cited by examiner

MOVE TO LEFT     NORMAL     MOVE TO RIGHT

LIQUID CRYSTAL DISPLAY DEVICE WITH SPACERS FACING CAPACITIVE ELEMENT

BACKGROUND OF THE INVENTION

1. Field of the Invention

The present invention relates to a liquid crystal display device, and more particularly to an active-matrix type liquid crystal display device.

2. Description of the Related Art

In an active-matrix type liquid crystal display device, gate signal lines which are extended in the x direction and are arranged in parallel in the y direction and drain signal lines which are extended in the y direction and are arranged in parallel in the x direction are formed on a liquid-crystal-side surface of one substrate out of respective substrates which are arranged to face each other in an opposed manner while sandwiching liquid crystal therebetween.

Respective regions which are surrounded by these respective signal lines constitute pixel regions and each pixel region is provided with a thin film transistor which is driven by a scanning signal supplied from the gate signal line and a pixel electrode to which a video signal is supplied from the drain signal line through the thin film transistor.

The pixel electrode generates an electric field between the pixel electrode and a counter electrode which is arranged in an opposed manner by way of the liquid crystal and liquid crystal is driven by this electric field such that the light transmittance thereof is changed.

Further, the pixel region is usually provided with a capacitive element between the pixel electrode and the signal line having a stable potential for storing the video signal supplied to the pixel electrode for a relatively long time.

SUMMARY OF INVENTION

However, along with the recent demand for high definition, the liquid crystal display device having such a constitution is largely affected by a drawback caused by the misalignment of the thin film transistor or the capacitive element.

That is, when the misalignment of the thin film transistor or the capacitive element is generated, the capacitance of the capacitive element is delicately changed and this generates the irregularities of display.

The present invention has been made in view of such a circumstance. One of the advantages of the present invention is enable a liquid crystal display device to overcome the drawback caused by the misalignment of thin film transistors or capacitive elements.

To briefly explain the summary of typical inventions out of inventions disclosed in this specification, they are as follows.

(1) A liquid crystal display device according to the present invention comprises, for example, a pair of substrates which are arranged to face each other in an opposed manner while sandwiching liquid crystal therebetween, pixel regions which are formed on a liquid-crystal-side surface of one substrate out of the pair of substrates, and thin film transistors which are formed on respective pixel regions, wherein the thin film transistor includes a gate electrode connected to a gate signal line, a semiconductor layer laminated to the gate electrode by way of an insulation film, a drain electrode formed on the semiconductor layer and connected to a drain signal line, and a source electrode connected to a pixel electrode, and the semiconductor layer is formed in a periodically irregular shape in a zone having a width substantially larger than a width of the source electrode on a side thereof from which at least the source electrode is pulled out.

(2) A liquid crystal display device according to the present invention comprises, for example, a pair of substrates which are arranged to face each other in an opposed manner while sandwiching liquid crystal therebetween, pixels which are formed on a liquid-crystal-side surface of one substrate out of the pair of substrates, and thin film transistors which are formed on respective pixels, wherein the thin film transistor includes a gate signal line, a semiconductor layer laminated to one region of the gate signal line by way of an insulation film, a drain electrode formed on the semiconductor layer and connected to a drain signal line, and a source electrode connected to a pixel electrode, the semiconductor layer is formed in a periodically irregular shape in a zone having a width substantially larger than a width of the source electrode on a side thereof from which at least the source electrode is pulled out, and the gate signal line has a side thereof from which the source electrode is pulled out stuck out in the vicinity of a region where the thin film transistor is formed whereby a width of the gate signal line is broadened.

(3) A liquid crystal display device according to the present invention is, for example, characterized in that:

on a liquid-crystal-side surface of one substrate out of a pair of substrates which face each other in an opposed manner while sandwiching liquid crystal therebetween, a plurality of gate signal lines which are arranged in parallel and a plurality of drain signal lines which are arranged in parallel while crossing the respective gate signal lines are formed, each pixel region which is surrounded by the gate signal lines and the drain signal lines is provided with a thin film transistor which is driven by scanning signals supplied from the one-side gate signal line, a pixel electrode to which video signals are supplied from the one-side drain signal line through the thin film transistor, and a capacitive element which is formed between the pixel electrode and the other-side gate signal line, and the capacitive element includes a first insulation film which is formed by extending the gate insulation film of the thin film transistor on the other-side gate signal line, a conductive layer which is formed on the insulation film, a second insulation film which is formed by extending a protective film covering the thin film transistor onto the conductive layer, and an extension portion of the pixel electrode which is formed on the second insulation film, wherein the extension portion is formed on the conductive layer via a through hole formed in the second insulation film.

(4) A liquid crystal display device according to the present invention is, for example, characterized in that:

on a liquid-crystal-side surface of one substrate out of a pair of substrates which face each other in an opposed manner while sandwiching liquid crystal therebetween, a plurality of gate signal lines which are arranged in parallel and a plurality of drain signal lines which are arranged in parallel while crossing the respective gate signal lines are formed, each pixel region which is surrounded by the gate signal lines and the drain signal lines is provided with a thin film transistor which is driven by scanning signals supplied from the one-side gate signal line, a pixel electrode to which video signals are supplied from the one-side drain signal line through the thin film transistor, and a capacitive element which is formed between the pixel electrode and the other-side gate signal line, the capacitive element includes a first insulation film which is formed by extending the gate insulation film of the thin film transistor on the other-side gate signal line, a conductive layer which is formed on the insulation film, a second insulation film which is formed by extending a protective film covering the thin film transistor onto the conductive layer, and an extension portion of the pixel electrode which is formed on the second insulation film, wherein the extension portion is formed on the conductive layer via a through hole formed in the second insulation film, and the conductive layer is formed such that the conductive layer is extended in the width direction of the gate signal line and strides over the gate signal line.

(5) A liquid crystal display device according to the present invention is, for example, characterized in that:

on a liquid-crystal-side surface of one substrate out of a pair of substrates which are arranged to face each other in an opposed manner while sandwiching liquid crystal therebetween, a plurality of gate signal lines which are arranged in parallel and a plurality of drain signal lines which are arranged in parallel while crossing the respective gate signal lines are formed, each pixel region which is surrounded by the gate signal lines and the drain signal lines is provided with a thin film transistor which is driven by scanning signals supplied from the one-side gate signal line, a pixel electrode to which video signals are supplied from the one-side drain signal line through the thin film transistor, and a capacitive element which is formed between the pixel electrode and the other-side gate signal line, the capacitive element includes a first insulation film which is formed by extending the gate insulation film of the thin film transistor on the other-side gate signal line, a conductive layer which is formed on the insulation film, a second insulation film which is formed by extending a protective film covering the thin film transistor onto the conductive layer, and an extension portion of the pixel electrode which is formed on the second insulation film, wherein the extension portion is formed on the conductive layer via a through hole formed in the second insulation film, and the liquid crystal display device includes columnar spacers which are formed on a liquid-crystal-side surface of the other substrate out of the pair of substrates and face the inside of regions where the capacitive elements are formed in an opposed manner, wherein the spacers are formed while obviating regions where the through holes are formed.

(6) A liquid crystal display device according to the present invention comprises, for example, a pair of substrates which are arranged to face each other in an opposed manner while sandwiching liquid crystal therebetween, pixel regions which are formed on a liquid-crystal-side surface of one substrate out of the pair of substrates, and thin film transistors which are formed on respective pixel regions, wherein each thin film transistor includes, on a gate electrode, a gate insulation film, a semiconductor layer which is formed on the gate insulation film and has an approximately semicircular pattern having an arcuate portion at the other pixel region side which is arranged while sandwiching the gate electrode between the semiconductor layer and the other pixel region side, a drain electrode which is formed on the semiconductor layer in an arcuate shape along the arcuate portion of the semiconductor layer, and a source electrode which has a circular shape positioned at a center point of the drain electrode forming the arcuate shape and has an extension portion which is extended toward the pixel region side while ensuring a width substantially equal to a diameter of the circular shape, and the semiconductor layer is formed in a periodically irregular shape in a zone having a width substantially larger than a width of the source electrode on a side other than the arcuate portion from which the source electrode is pulled out.

(7) A liquid crystal display device according to the present invention is, for example, characterized in that:

on a liquid-crystal-side surface of one substrate out of a pair of substrates which face each other in an opposed manner while sandwiching liquid crystal therebetween, a plurality of gate signal lines which are arranged in parallel and a plurality of drain signal lines which are arranged in parallel while crossing the respective gate signal lines are formed, each pixel region which is surrounded by the gate signal lines and the drain signal lines is provided with a thin film transistor which is driven by scanning signals supplied from the one-side gate signal line, a pixel electrode to which video signals are supplied from the one-side drain signal line through the thin film transistor, and a capacitive element which is formed between the pixel electrode and the other-side gate signal line, the thin film transistor includes, on the one-side gate signal line, a gate insulation film, a semiconductor layer which is formed on the gate insulation film and has an approximately semicircular pattern having an arcuate portion at the other pixel region side which is arranged while sandwiching the one-side gate signal line between the semiconductor layer and the other pixel region side, a drain electrode which is formed on the semiconductor layer in an arcuate shape along the arcuate portion of the semiconductor layer, and a source electrode which has a circular shape positioned at a center point of the drain electrode forming the arcuate shape and has an extension portion which is extended toward the pixel region side while ensuring a width substantially equal to a diameter of the circular shape, and the capacitive element includes a first insulation film which is formed by extending the gate insulation film of the thin film transistor on the other-side gate signal line, a second insulation film which is formed by extending a protective film covering the thin film transistor, and an extension portion of the pixel electrode which is formed on the second insulation film, and the other-side gate signal line which constitutes a portion of the capacitive element is provided with a projection portion which is superposed on a portion of the pixel electrode of other pixel region which sandwiches the gate signal line with the pixel region.

(8) A liquid crystal display device according to the present invention comprises, for example, a pair of substrates which are arranged to face each other in an opposed manner while sandwiching liquid crystal therebetween, pixel regions which are formed on a liquid-crystal-side surface of one substrate out of the pair of substrates, and thin film transistors which are formed on respective pixel regions, wherein the thin film transistor includes, on a gate electrode, a gate insulation film, a semiconductor layer which is formed on the gate insulation film and has an approximately semicircular pattern having an arcuate portion at the other pixel region side which is arranged while sandwiching the gate electrode between the semiconductor layer and the other pixel region side, a drain electrode which is formed on the semiconductor layer in an arcuate shape along the arcuate portion of the semiconductor layer, and a source electrode which has a circular shape positioned at a center point of the drain electrode forming the arcuate shape and has an extension portion which is extended toward the pixel region side while ensuring a width substantially equal to a diameter of the circular shape, and the gate electrode includes a projection portion which is superposed on the source electrode at a side thereof from which a source electrode of the thin film transistor is pulled out and is extended in the extending direction of the source electrode.

(9) A liquid crystal display device according to the present invention is, for example, characterized in that:

on a liquid-crystal-side surface of one substrate out of a pair of substrates which face each other in an opposed manner while sandwiching liquid crystal therebetween, a plurality of gate signal lines which are arranged in parallel and a plurality of drain signal lines which are arranged in parallel while crossing the respective gate signal lines are formed, each pixel region which is surrounded by the gate signal lines and the drain signal lines is provided with a thin film transistor which is driven by scanning signals supplied from the one-side gate signal line, a pixel electrode to which video signals are supplied from the one-side drain signal line through the thin film transistor, and a capacitive element which is formed between the pixel electrode and the other-side gate signal line, the thin film transistor includes, on the one-side gate signal line, a gate insulation film, a semiconductor layer which is formed on the gate insulation film and has an approximately semicircular pattern having an arcuate portion at the other pixel region side which is arranged while sandwiching the one-side gate signal line between the semiconductor layer and the other pixel region side, a drain electrode which is formed on the semiconductor layer in an arcuate shape along the arcuate portion of the semiconductor layer, and a source electrode which has a circular shape positioned at a center point of the drain electrode forming the arcuate shape and has an extension portion which is extended toward the pixel region side while ensuring a width substantially equal to a diameter of the circular shape, the capacitive element includes at least a first insulation film which is formed by extending the gate insulation film of the thin film transistor on the other-side gate signal line, a second insulation film which is formed by extending a protective film covering the thin film transistor, and an extension portion of the pixel electrode which is formed on the second insulation film, the second insulation film is formed of either an organic material layer alone or a sequential laminated body made of an inorganic material layer and an organic material layer, and the other-side gate signal line which constitutes a portion of the capacitive element is provided with a projection portion which is superposed on a portion of the pixel electrode of other pixel region which sandwiches the gate signal line with the pixel region.

DETAILED DESCRIPTION

Preferred embodiments of a liquid crystal display device according to the present invention are explained hereinafter in conjunction with attached drawings.

EMBODIMENT 1

Figure 2:
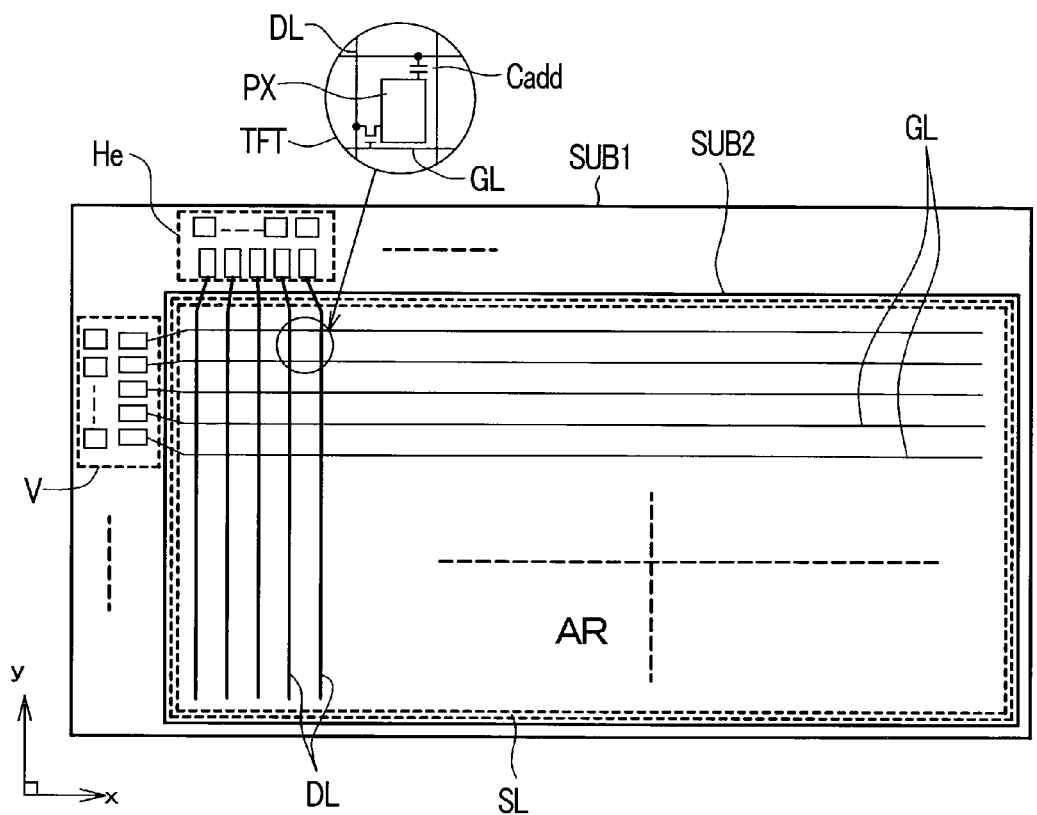
FIG. 2 is an overall plan view showing one embodiment of the liquid crystal display device according to the present invention.

FIG. 2 is a plan view showing one embodiment of the liquid crystal display device according to the present invention.

In the drawing, a pair of transparent substrates SUB1 and SUB2 which are arranged to face each other in an opposed manner by way of liquid crystal. The liquid crystal is filled in a space defined by a pair of these transparent substrates SUB1, SUB2 using a seal member SL which also performs a function of fixing the other transparent substrates SUB2 to one transparent substrate SUB1.

On a liquid-crystal-side surface of one transparent substrate SUB1 which is surrounded by the seal member SL, gate signal lines GL which are extended in the x direction and are arranged in parallel in the y direction and drain signal lines DL which are extended in the y direction and are arranged in parallel in the x direction are formed.

Regions which are surrounded by respective gate signal lines GL and respective drain signal lines DL constitute pixel regions and a mass of these pixel regions arranged in a matrix array constitutes a liquid crystal display part AR.

Each pixel region is provided with a thin film transistor TFT which is driven by a scanning signal supplied from the one-side gate signal line GL and a pixel electrode PX to which a video signal is supplied from the one-side drain signal line DL through the thin film transistor TFT.

The pixel electrode PX generates an electric field between the pixel electrode PX and a counter electrode (not shown in the drawing) which is formed in common with respective pixel regions at the other transparent substrate SUB2 side. The light transmittance of the liquid crystal is controlled in response to the electric field.

Respective one ends of the gate signal lines GL are extended over the seal member SL and the extended ends constitute terminals to which output terminals of a vertical scanning driving circuit V are connected. Further, signals supplied from a printed circuit board which is arranged outside a liquid crystal display panel are inputted to input terminals of the vertical scanning driving circuit V.

The vertical scanning driving circuit V is constituted of a plurality of semiconductor devices, wherein a plurality of neighboring gate signal lines are formed into a group and one semiconductor device is allocated to each group.

In the same manner, respective one ends of the drain signal lines DL are extended over the seal member SL and these extended ends constitute terminals to which output terminals of a video signal driving circuit He are connected. Further, signals supplied from a printed circuit board which is arranged outside the liquid crystal display panel are inputted to input terminals of the video signal driving circuit He.

The video signal driving circuit He is also constituted of a plurality of semiconductor devices, wherein a plurality of neighboring drain signal lines DL are formed into a group and one semiconductor device is allocated to each group.

Respective gate signal lines GL are configured to be sequentially selected one after another in response to the scanning signals supplied from the vertical scanning circuit V.

Further, the video signals are supplied to the respective drain signal lines DL from the video signal driving circuit He at the timing which matches the selection of the gate signal lines GL.

Figure 1:
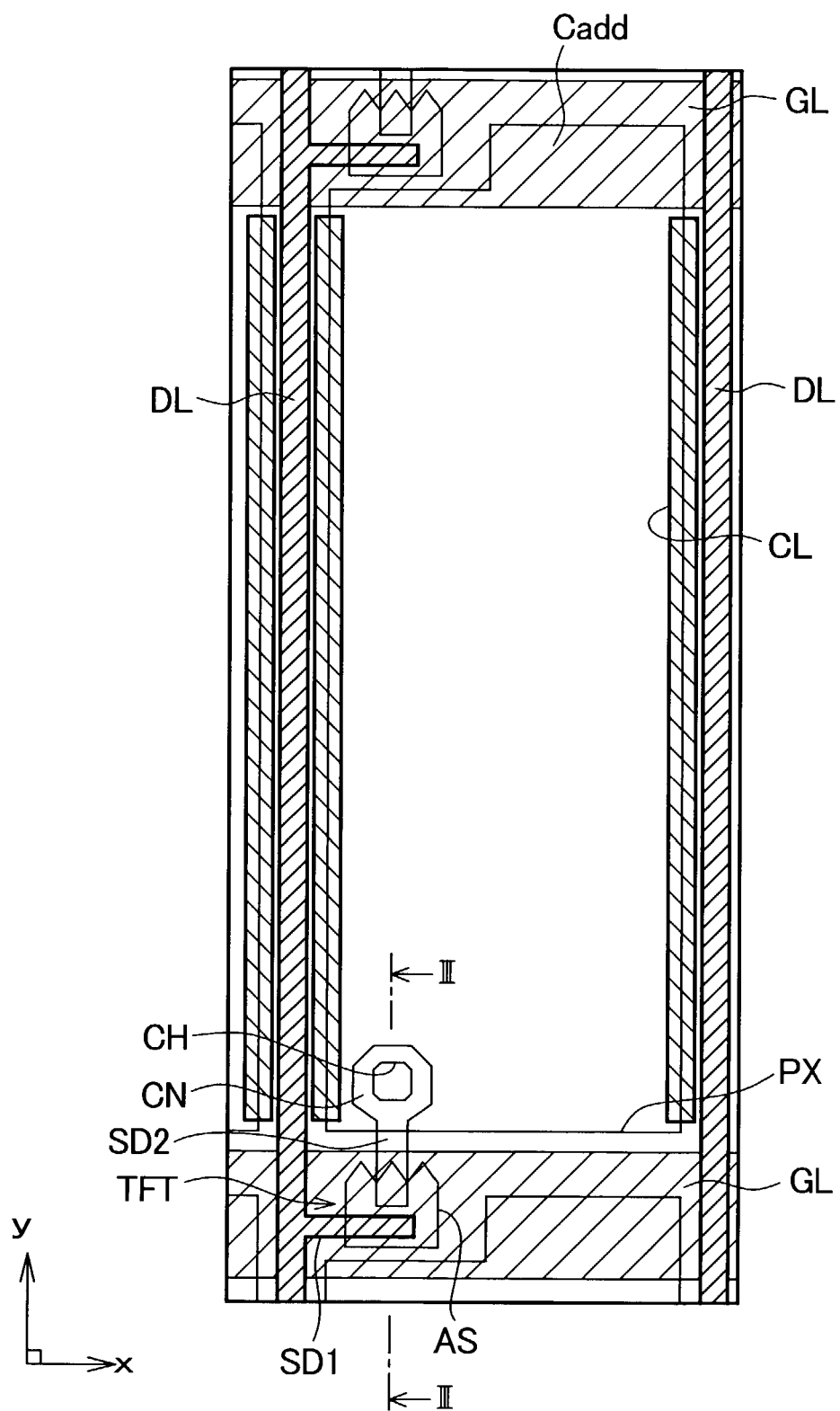
FIG. 1 is a plan view showing one embodiment of a pixel of a liquid crystal display device according to the present invention.
Figure 3:
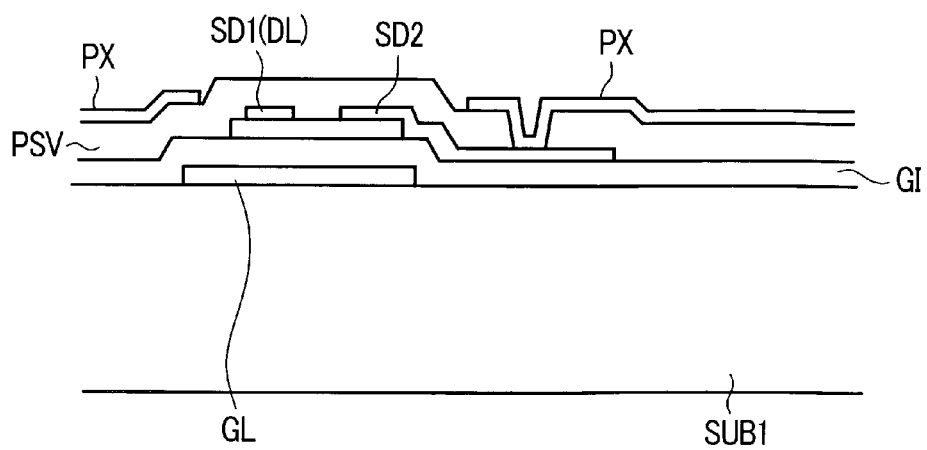
FIG. 3 is a cross-sectional view taken along a line III—III of FIG. 1.

FIG. 1 is a view showing the constitution of the pixel region and FIG. 3 is a cross-sectional view taken along a line III—III of FIG. 1.

In FIG. 1, first of all, a pair of gate signal lines GL which are extended in the x direction and are arranged in parallel in the y direction are formed on the liquid-crystal-side surface of the transparent substrate SUB1.

These gate signal lines GL surround a rectangular region together with a pair of drain signal lines DL which will be explained later and this region constitutes the pixel region.

Here, light shielding films CL are formed simultaneously with the formation of these gate signal lines GL, wherein the light shielding films CL are provided at left and right sides of the pixel region and in parallel to and close to the drain signal lines DL.

These light shielding films CL define the pixel region together with a black matrix formed at the transparent substrate SUB2 side. Due to the presence of the light shielding films CL, the tolerance at the time of aligning the transparent substrate SUB2 to the transparent substrate SUB1 can be increased.

On a surface of the transparent substrate SUB1 on which the gate signal lines GL and the light shielding films CL are formed in the above-mentioned manner, an insulation film GI made of SiN, for example, is formed such that the insulation film GI also covers the gate signal lines GL.

The insulation film GI performs a function of an interlayer insulation film with respect to the gate signal lines GL in a region in which the drain signal lines DL are formed as will be explained later, performs a function of a gate insulation film in a region in which the thin film transistor TFT is formed as will be explained later, and performs a function of a dielectric film in a region in which a capacitive element Cadd is formed as will be explained later.

Then, on a surface of the insulation film GI, a semiconductor layer AS made of amorphous Si, for example, is formed such that the semiconductor layer AS is superposed on a portion of the gate signal line GL.

The semiconductor layer AS constitutes a part of the thin film transistor TFT. By forming a drain electrode SD1 and a source electrode SD2 on an upper surface of the semiconductor layer AS, it is possible to form an MIS type transistor having an inverse staggered structure which employs a portion of the gate signal line GL as a gate electrode.

Here, the drain electrode SD1 and the source electrode SD2 are simultaneously formed with the formation of the drain signal lines DL, for example.

That is, the drain signal lines DL which are extended in the y direction and are arranged in parallel in the x direction are formed, the portions of the drain signal lines DL are extended over upper surfaces of the semiconductor layers AS so as to form the drain electrodes SD1, and each source electrode SD2 is formed such that each source electrode SD2 is spaced apart from each drain electrode SD1 by a distance corresponding to a length of a channel of the thin film transistor TFT.

The source electrode SD2 is slightly extended over an upper surface of the insulation film GI at the pixel region side from the surface of the semiconductor layer AS so as to form a contact portion CN which is served for the connection between the source electrode SD2 and the pixel electrode PX which will be explained later.

Here, the semiconductor layer AS is formed in a serrated pattern which periodically repeats projection and indentation at least at a side portion from which the source electrode SD2 which is formed on an upper layer of the semiconductor layer AS is pulled out to a region where the semiconductor layer AS is not formed.

The reason that such a constitution is adopted is to overcome a drawback caused by the discontinuity of the source electrode SD2 at a stepped portion of the semiconductor layer AS. That is, by increasing the length of the stepped portion by adopting the above-mentioned serrated pattern, it is possible to prevent a portion where the discontinuity occurs from covering the whole stepped portion.

Further, in the formation of the source electrode SD2 on the semiconductor layer AS, even when the misalignment (particularly, the misalignment in the x direction) of the source electrode SD2 is generated, it is possible to prevent the change of the area of the source electrode SD which is superposed on the semiconductor layer AS.

Here, why the misalignment in the x direction is to be taken into account is that, with respect to the liquid crystal display part AR, a side thereof in the x direction is generally larger than a side thereof in the y direction and hence, the misalignment in the x direction is larger than the misalignment in the y direction whereby the misalignment in the x direction can not be ignored.

Here, thin layers doped with impurities of high concentration are formed on an interface between the semiconductor layer AS and the drain electrode SD1 and an interface between the semiconductor layer AS and the source electrode SD2 and these layers function as contact layers.

With respect to these contact layers, at the time of forming the semiconductor layer AS, for example, an impurity layer of high concentration is formed on a surface of the semiconductor layer AS preliminarily and, using the drain electrode SD1 and the source electrode SD2 formed on an upper surface of the semiconductor layer AS as masks, the impurity layer which is exposed from the drain electrode SD1 and the source electrodes SD2 are etched to form the contact layers.

On the surface of the transparent substrate SUB1 on which the thin film transistors TFT, the drain signal lines DL, the drain electrodes SD1 and the source electrodes SD2 are formed, a protective film PSV which is constituted of a sequential laminated body formed of an inorganic material layer made of SiN or the like and an organic material layer such as resin, for example, is formed. The protective film PSV is provided as a layer which obviates the direct contact between the thin film transistors TFT and the liquid crystal and can prevent the deterioration of the characteristics of the thin film transistors TFT.

Pixel electrodes PX are formed on an upper surface of the protective film PSV. Each pixel electrode PX is constituted of a light-transmitting conductive film formed of an ITO (Indium-Tin-Oxide) film, for example.

The pixel electrode PX is formed such that the pixel electrode PX occupies the most portion of the pixel region while obviating a region where a thin film transistor TFT is formed. The pixel electrode PX has a portion thereof electrically connected with the source electrode SD2 of the thin film transistor TFT via a contact hole CH formed in a portion of the protective film PSV.

Further, the pixel electrode PX is extended over other neighboring gate signal line GL which is different from the gate signal line GL for driving the thin film transistor TFT which is connected to the pixel electrode PX thus forming a portion which is superposed on the other gate signal line GL.

In this portion, the capacitive element Cadd which uses the above-mentioned protective film PSV as a dielectric film is formed between the pixel electrode PX and the other gate signal line GL.

The capacitive element Cadd is configured to have a function of storing the video signal supplied to the pixel electrode PX for a relatively long time, for example.

On the upper surface of the transparent substrate SUB1 on which the pixel electrodes PX are formed, an orientation film (not shown in the drawing) is formed such that the orientation film also covers the pixel electrodes PX. The orientation film is a film which is brought into direct contact with the liquid crystal and determines the initial orientation direction of liquid crystal molecules by a rubbing formed on a surface thereof.

With respect to the liquid crystal display device having such a constitution, as mentioned previously, at the time of forming the source electrodes SD2 of the thin film transistors TFT, even when the misalignment (particularly, the misalignment in the x direction in the drawing) is generated with respect to the semiconductor layer AS, the area of the portion where the semiconductor layer AS and the source electrode SD are superposed each other remains unchanged.

Figure 4:
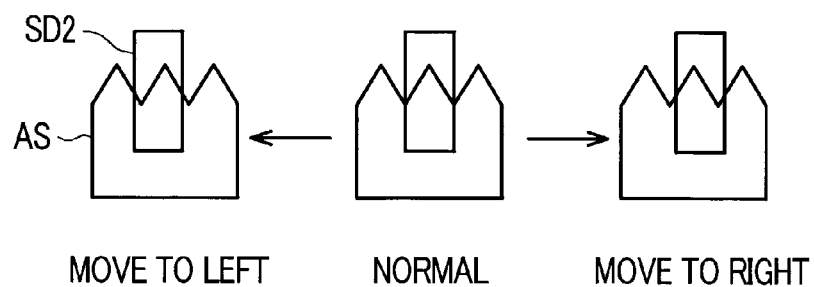
FIG. 4 is an explanatory view showing an advantageous effect of the liquid crystal display device according to the present invention.
Figures 5A, 5B, 5C, 5D:
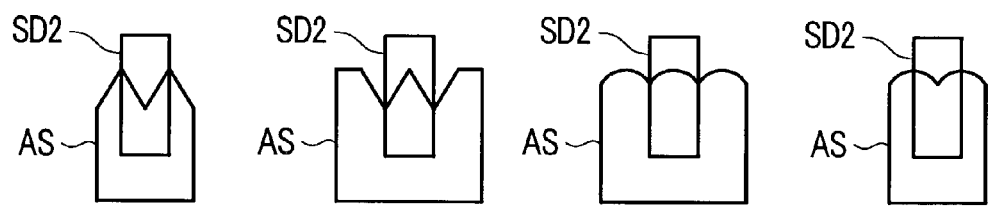
FIG. 5 is a plan view of an essential part showing another embodiment of the liquid crystal display device according to the present invention.

FIG. 4 is an explanatory view showing a case in which the source electrode SD is normally formed with respect to the semiconductor layer AS and cases in which the source electrode SD is moved in the left and right directions with respect to the semiconductor layer AS.

Since the side of the semiconductor layer AS from which the source electrode SD2 is pulled out is formed in a serrated pattern which periodically repeats projection and indentation, a following relationship can be established. That is, even when the source electrode SD2 is displaced and increases the superposition with the semiconductor layer AS at one side in the displacement direction, the source electrode SD2 decreases the superposition with the semiconductor layer AS at the other side opposite to one side in the moving direction by an amount corresponding to the increase of the superposition.

Accordingly, the gate-source capacitance (Cgs) of the thin film transistor TFT can be held at a fixed value and remains unchanged irrespective of the misalignment of the source electrode SD2.

As can be understood from the above-mentioned explanation, it is necessary for the periodically irregular shape to be formed on the semiconductor layer AS in a width span which has a width larger than a width of the source electrode SD2 and such a width is determined based on the maximum value of the misalignment of the source electrode SD which is obtained by experience.

In the above-mentioned embodiment, the repetition of periodically irregularities formed on the side of the semiconductor layer AS from which the source electrode SD2 is pulled out defines a serrated shape which is formed by bending a straight line in a zigzag shape. However, the periodically irregular shape is not determined in a strict sense and may adopt patterns shown in FIG. 5A to FIG. 5D. In short, the advantageous effect of the present invention is achieved by a pattern by repeating the periodically irregularities of same shape.

EMBODIMENT 2

Figure 6:
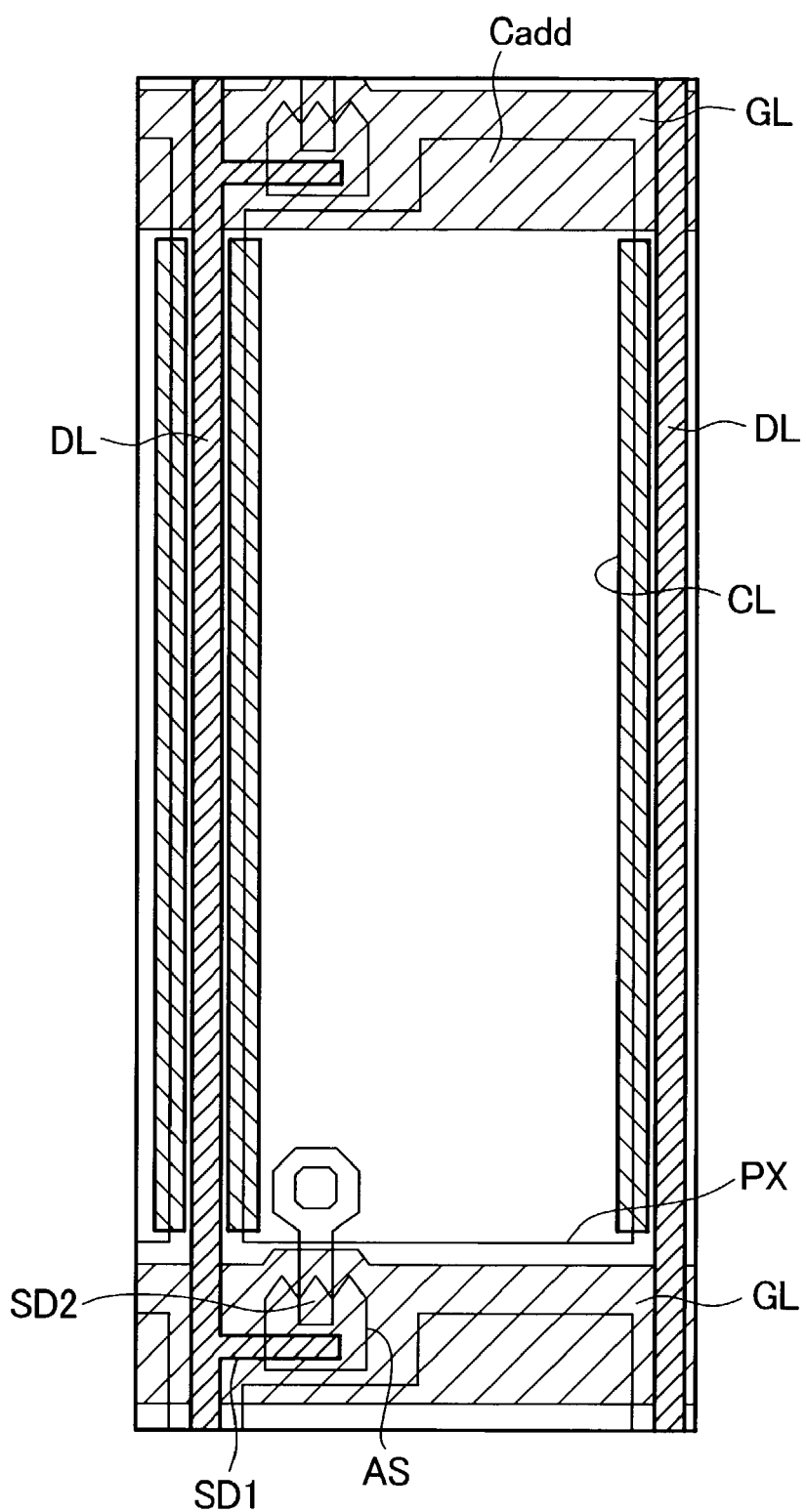
FIG. 6 is a plan view showing another embodiment of the pixel of the liquid crystal display device according to the present invention.

FIG. 6 is a view showing the constitution of another embodiment of the liquid crystal display device according to the present invention and corresponds to FIG. 1.

The constitution which renders this embodiment different from the embodiment shown in FIG. 1 is that, a gate signal line GL widens a portion thereof in the vicinity where a semiconductor layer AS of a thin film transistor TFT is superposed on the gate signal line. Particularly, a side portion of the gate signal line GL from which a source electrode SD2 of the thin film transistor TFT is pulled out is formed in a pattern which is projected or stuck out toward the pixel region side.

Due to such a constitution, it is possible to obviate the generation of a phenomenon that the misalignment of the semiconductor layer AS with respect to the gate signal line GL, makes a portion of the semiconductor layer AS stuck out from the gate signal line GL.

Advantageous effect by the above-mentioned characteristic pattern of the semiconductor layer AS shown in the embodiment 1 can be obtained on the premise that the semiconductor layer AS is superposed on the gate signal line GL and cannot be obtained when the portion of the semiconductor layer AS is stuck out from the gate signal line GL.

EMBODIMENT 3

Figure 7:
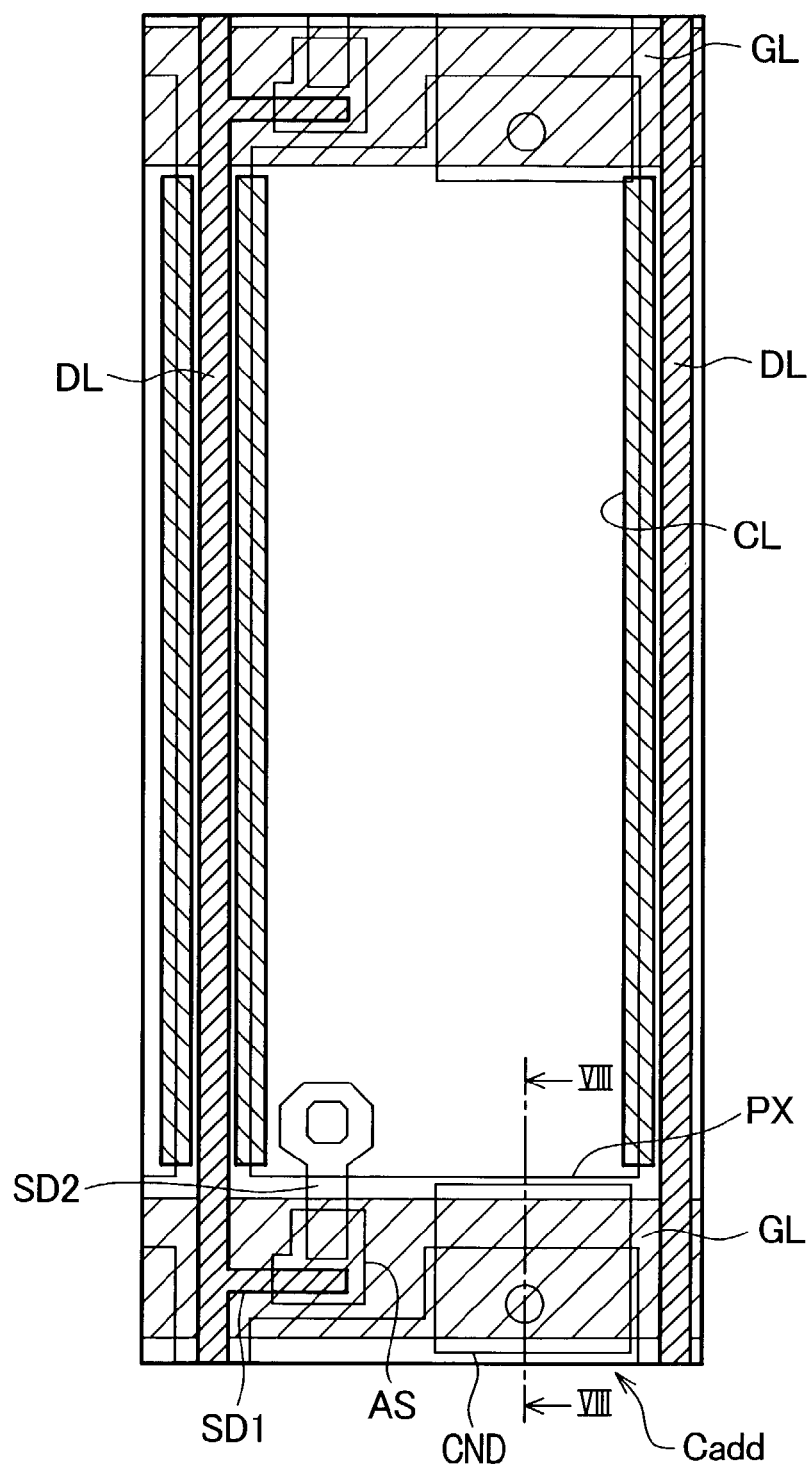
FIG. 7 is a plan view showing another embodiment of the pixel of the liquid crystal display device according to the present invention.
Figure 8:
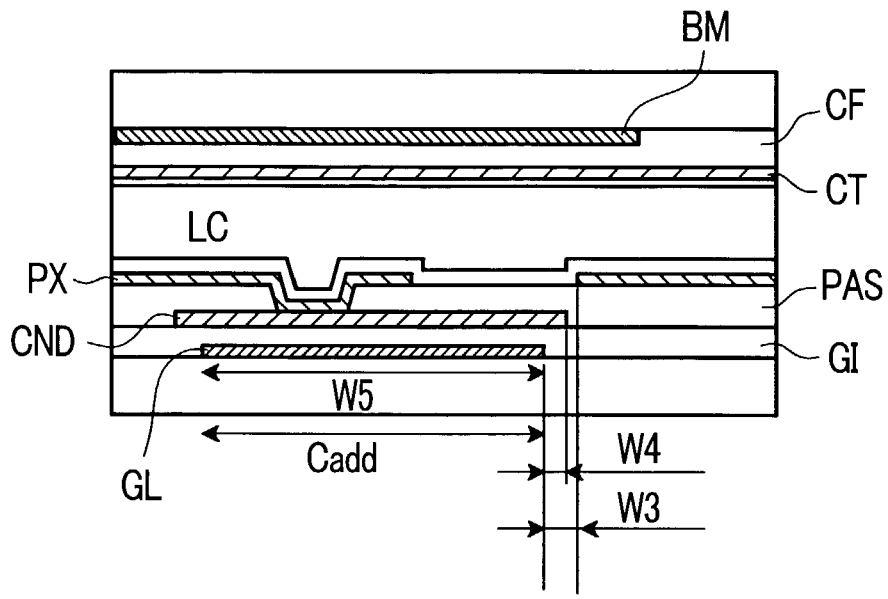
FIG. 8 is a cross-sectional view taken along a line VIII—VIII of FIG. 7.

FIG. 7 is a view showing the constitution of another embodiment of the liquid crystal display device according to the present invention and corresponds to FIG. 1. Further, FIG. 8 is a cross-sectional view taken along a line VIII—VIII of FIG. 7.

The constitution which renders this embodiment different from the embodiment shown in FIG. 1 lies in a capacitive element Cadd. That is, a conductive layer CND is formed on a substrate SUB1 by way of a gate signal line GL and an insulation film GI, and the conductive layer CND is connected to an extension portion of a pixel electrode PX via a through hole formed in a protective film PSV formed as a layer above the conductive layer CND.

Here, the conductive layer CND is formed simultaneously with the formation of drain signal lines DL, for example.

Due to such a constitution, it is possible to increase the capacity of the capacitive element Cadd without decreasing an aperture portion of a pixel region.

In this case, however, it is deniable that corresponding to the increase of the capacitance of the capacitive element Cadd, the fluctuation of the capacitance value is increased due to the misalignment of the conductive layer CND by an amount corresponding to the increased amount of capacitance of the capacitive element Cadd.

To cope with such a drawback, in this embodiment, the conductive layer CND is formed such that the conductive layer CND sufficiently strides over the gate signal line GL in the widthwise direction of the gate signal line GL. Due to such a constitution, even when the misalignment in the y direction in the drawing in the embodiment is generated with respect to the conductive layer CND, the area of a portion where the conductive layer CND and the gate signal line GL are superposed each other remains unchanged and hence, it is possible to obtain an advantageous effect that the capacitance of the capacitive element Cadd is not fluctuated.

As shown in FIG. 8, assuming a width of the gate signal line GL as W5, a hang-out width of one hang-out portion of the conductive layer CND formed astride the gate signal line GL as W4 and a spaced-apart distance between the gate signal line GL and the pixel electrode PX as W3, by setting these factors such that the relationship expressed by a following formula is established, the increase of parasitic capacitance of the pixel electrode PX can be obviated and, at the same time, the fluctuation of capacitance value of the capacitive element Cadd can be suppressed.

$$\frac{1}{4} \times W3 \leq W4 \leq \frac{3}{4} \times W3 \qquad (1)$$

Further, this embodiment is configured such that no countermeasure is taken to cope with the misalignment between the thin film transistor TFT and the source electrode SD2 thereof. However, it is needless to say that the constitution described in Embodiment 1 and Embodiment 2 can be adopted as it is.

EMBODIMENT 4

Figure 9:
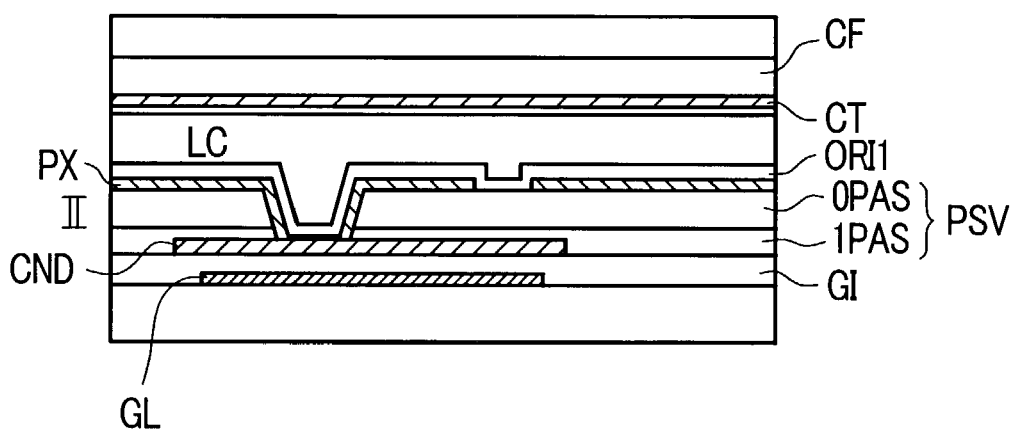
FIG. 9 is a cross-sectional view showing another embodiment of the pixel of the liquid crystal display device according to the present invention.

FIG. 9 is a view showing the constitution of another embodiment of the liquid crystal display device according to the present invention and corresponds to FIG. 8.

The constitution which renders this embodiment different from the embodiment shown in FIG. 8 is that a protective film PSV is formed of a sequential laminated body consisting of a protective film IPAS made of an inorganic material layer and a protective film OPAS made of an organic material layer, and the electrical connection between the conductive layer CND and the pixel electrode PX is established via a through hole formed in the sequential laminated body.

Due to the formation of such a protective film PSV, it is possible to flatten the surface of the protective film PSV and hence, the rubbing treatment of an orientation film ORIL which is formed covering not only the protective film PSV but also the pixel electrodes PX can be performed reliably. Further, although it is deniable that the capacitance value of the capacitive element Cadd is reduced due to the formation of the protective film OPAS made of an organic material layer, this embodiment has an advantageous effect that a reduction amount of the capacitance value can be suppressed within a range of extremely small amount.

Although, in this embodiment, the protective film PSV is formed of the sequential laminated body consisting of the protective film IPAS made of the inorganic material layer and the protective film OPAS made of the organic material layer, it is needless to say that a similar advantageous effect can be obtained even when the protective film PSV is formed of only the protective film OPAS made of the organic material layer.

Further, this embodiment is not provided with a measure to cope with the misalignment between the thin film transistor TFT and the source electrode SD2 thereof. However, it is needless to say that this embodiment can also directly adopt the constitution described either in the embodiment 1 or the embodiment 2.

EMBODIMENT 5

Figure 10:
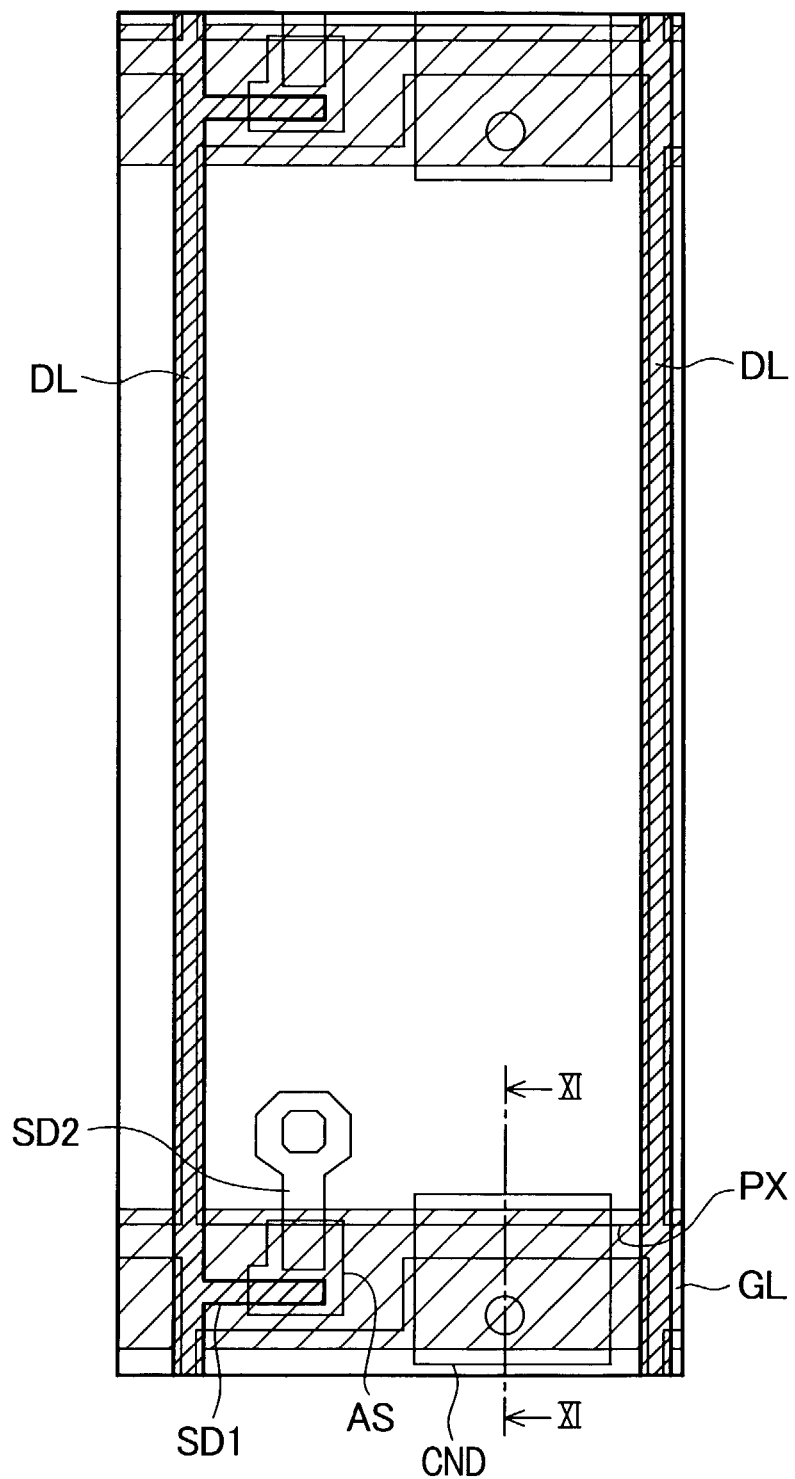
FIG. 10 is a plan view showing another embodiment of the pixel of the liquid crystal display device according to the present invention.
Figure 11:
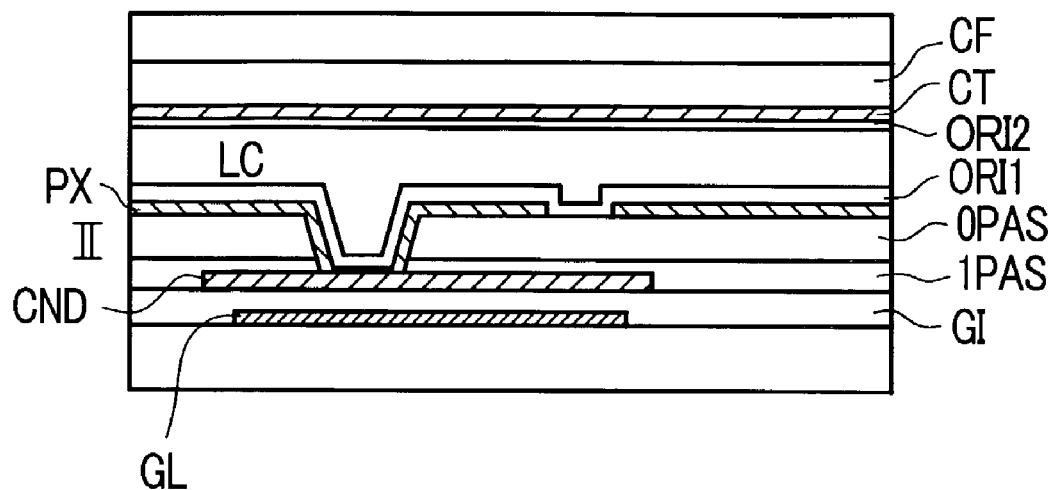
FIG. 11 is a cross-sectional view taken along a line XI—XI of FIG. 10.

FIG. 10 is a view showing the constitution of another embodiment of the liquid crystal display device according to the present invention and corresponds to FIG. 7. Further, FIG. 11 is a cross-sectional view taken along a line XI—XI of FIG. 10.

The constitution which renders this embodiment different from the embodiment shown in FIG. 7 lies in that a pixel electrode PX is extended to a gate signal line GL side such that the pixel electrode PX is superposed on a portion of an x direction side of the gate signal line GL. Further, the pixel electrode PX is also extended to drain signal line DL sides and is superposed on portions of the drain signal lines DL.

Due to such a constitution, the numerical aperture of a pixel region can be enhanced. In this case, although the pixel electrode PX is partially superposed on the conductive layer CND, the capacitance which is generated between the pixel electrode PX and the conductive layer CND can be largely suppressed due to a protective film OPAS made of organic material whereby it is possible to obtain an advantageous effect that an adverse effect to an image quality can be prevented.

EMBODIMENT 6

Figure 12:
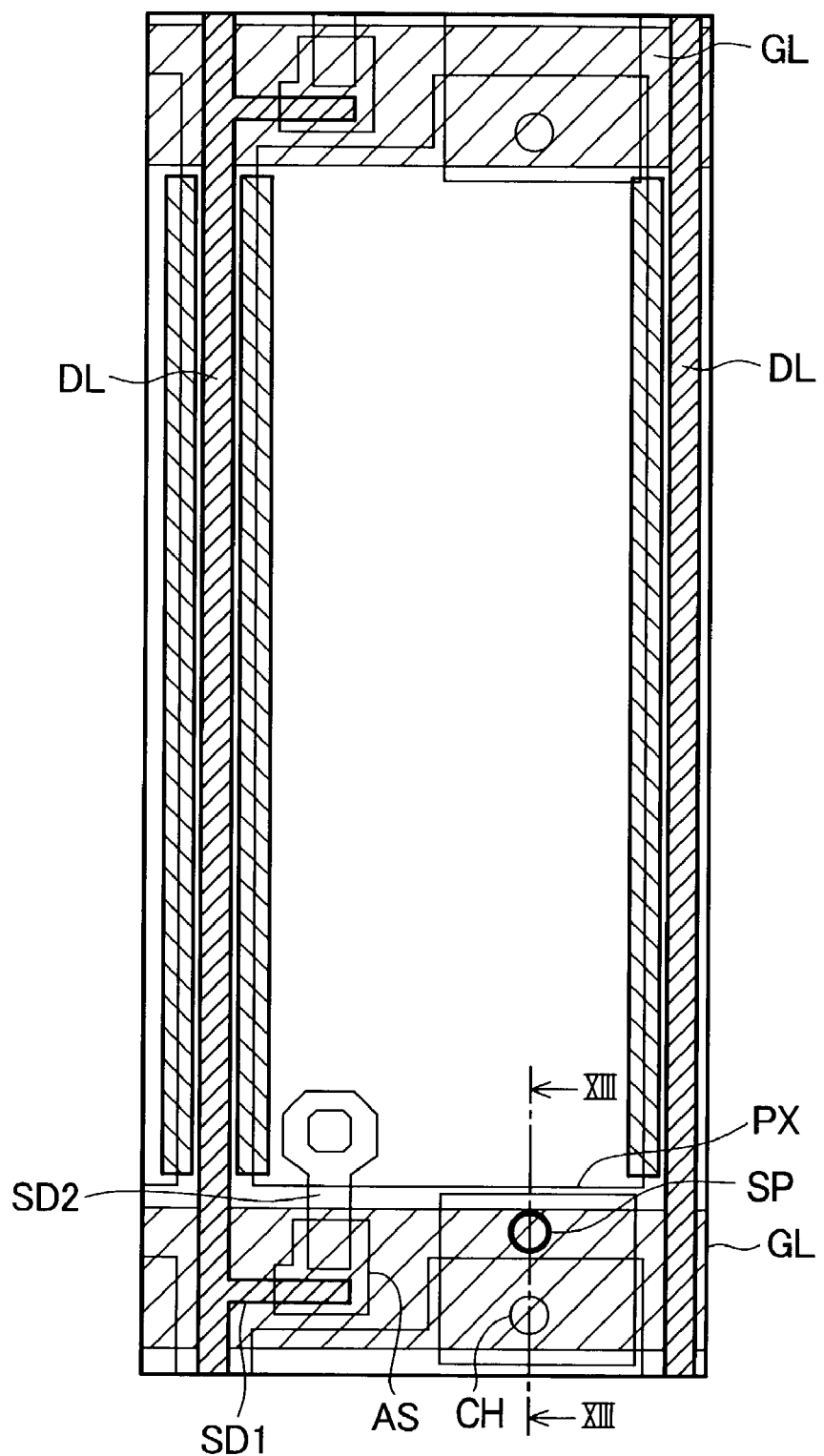
FIG. 12 is a plan view showing another embodiment of the pixel of the liquid crystal display device according to the present invention.

FIG. 12 is a view showing the constitution of another embodiment of the liquid crystal display device according to the present invention and corresponds to FIG. 7. Further, FIG. 13 is a cross-sectional view taken along a line XIII—XIII of FIG. 12.

Figure 13:
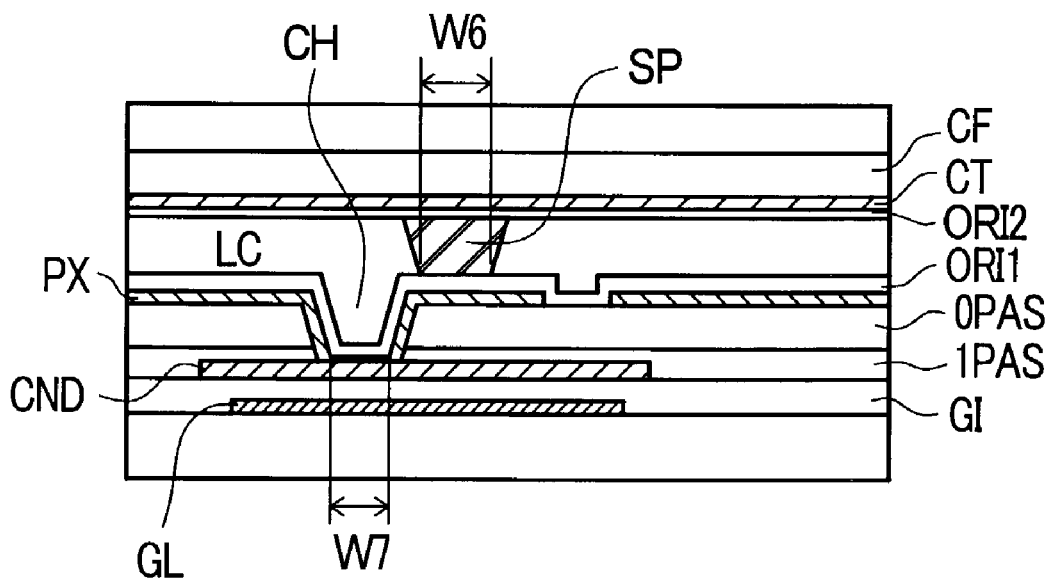
FIG. 13 is a cross-sectional view taken along a line XIII—XIII of FIG. 12.

The constitution which renders this embodiment different from the embodiment shown in FIG. 13 lies in that the constitution of spacers SP which are provided for forming a gap between a transparent substrate SUB1 and a transparent substrate SUB2 uniform is explicitly defined.

That is, the spacers SP are constituted of columnar spacers SP which are formed on a liquid-crystal-side surface of the transparent substrate SUB2. These spacers SP are formed to face capacitive elements Cadd in an opposed manner. A region where the capacitive element Cadd is formed has a relatively large area. Accordingly, by arranging the spacers SP to face the capacitive element Cadd, it is possible to prevent the reduction of the numerical aperture.

The columnar spacers SP are formed by selectively etching an organic material layer applied to a whole liquid-crystal-side surface of the transparent substrate SUB2 using a photolithography technique and positions where these spacers SP are formed can be arbitrarily determined.

Then, the columnar spacer SP is arranged in the inside of the region where the capacitive element Cadd is formed while obviating a through hole portion CH which is provided for connecting a conductive layer CND and a extention portion of a pixel electrode PX to each other. This is because that when the spacer SP is arranged to face the through hole portion CH in an opposed manner, the gap accuracy cannot be ensured.

Further, as shown in FIG. 13, assuming a size of a top portion of the spacer SP (a diameter when a cross-section of the spacer SP is circular and a width when the cross-section is rectangular) as W6 and a size of a bottom surface of the through hole portion CH (a diameter when a cross-section of the through hole portion CH is circular and a width when the circular cross-section is rectangular) as W7, it is desirable to determine the relationship between these sizes as W6>W7.

Such a provision is adopted to prevent a phenomenon that at the time of aligning the transparent substrate SUB2 to the transparent substrate SUB1, the relative position between these substrates is delicately displaced so that the spacer SP is completely fitted into the through hole portion CH and cannot be pulled out from the through hole portion CH.

Figure 14A:
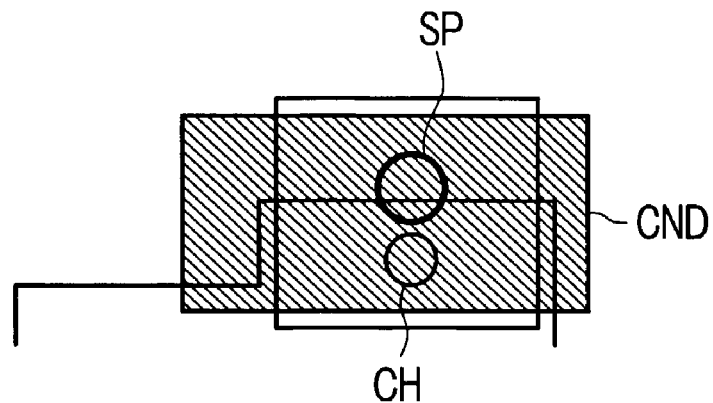
FIG. 14 is a plan view of an essential part showing another embodiment of the liquid crystal display device according to the present invention.
Figure 14B:
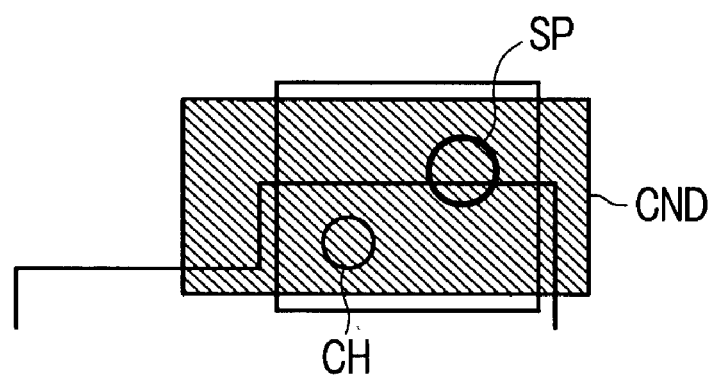
Figure 14C:
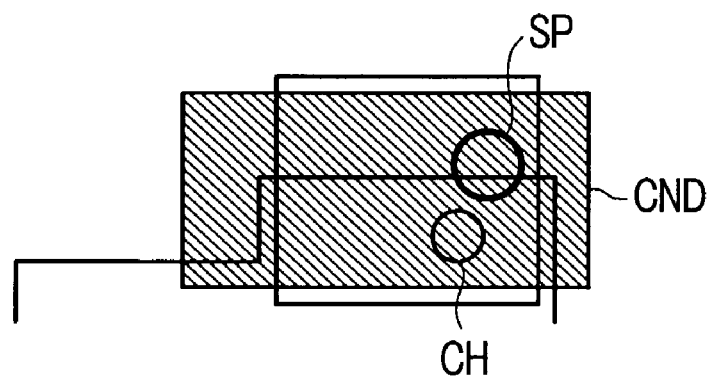

Here, so long as the spacer SP is formed in the inside of the region where the capacitive element Cadd is formed and at the position which can obviate the through hole portion CH, the spacer SP may be arranged at a position shown in FIG. 14A to FIG. 14C, for example.

EMBODIMENT 7

Figure 15:
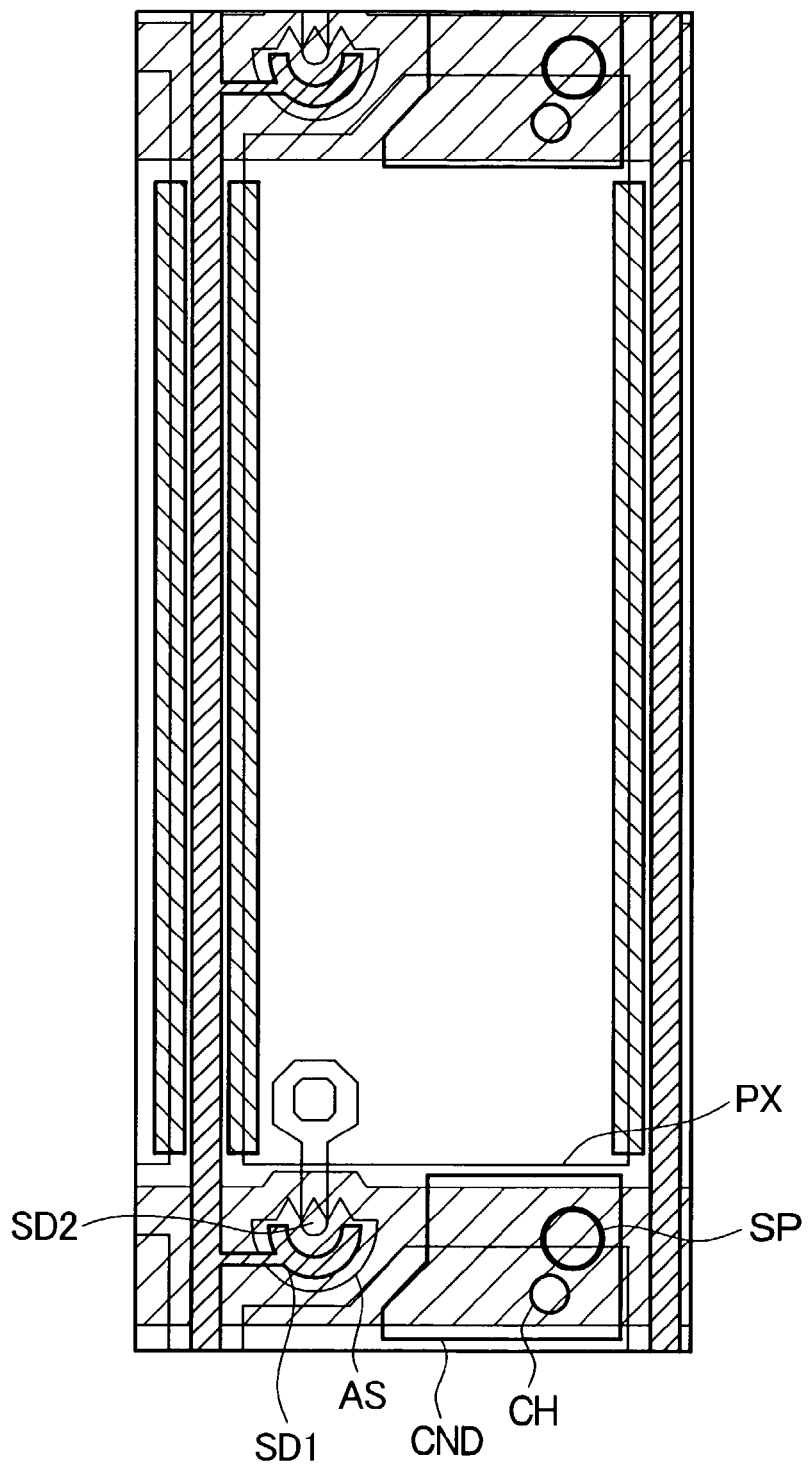
FIG. 15 is a plan view showing another embodiment of the pixel of the liquid crystal display device according to the present invention.

FIG. 15 is a view showing the constitution of another embodiment of a liquid crystal display device according to the present invention and corresponds to FIG. 12.

The constitution which renders this embodiment different from the embodiment shown in FIG. 12 lies in the constitution of thin film transistors TFT. That is, in each thin film transistor TFT, a semiconductor layer AS is formed in an approximately semicircular pattern having an arcuate portion at a side opposite to a pixel region, a drain electrode SD1 is formed in an arcuate shape along the arcuate portion of the semiconductor layer AS, and a source electrode SD2 has a circular shape and is positioned at a center point of the arcuate drain electrode SD1. The source electrode SD2 is formed such that the source electrode SD2 has also an extension portion which has a width equal to the diameter thereof and extended toward the pixel region side.

The thin film transistor TFT having such a constitution has a writing ability which corresponds to a length of the arcuate drain electrode SD1 and the width of the source electrode SD2 can be made considerably small and hence, gate-source capacitance (Cgs) can be reduced and the fluctuation of the capacitance can be also reduced.

However, when the width of the source electrode SD2 is small, a broken step is liable to occur at a stepped portion of the semiconductor layer AS. This embodiment is characterized in that, particularly with respect to the semiconductor layer AS formed in an approximately semicircular pattern, a portion excluding the arcuate portion, that is, a side portion from which the source electrode SD2 is pulled out is formed in a periodically irregular shape.

Due to such a constitution, the stepped portion of the semiconductor layer AS which is coated with the source electrode SD2 can increase the length thereof by the zigzag arrangement so that even when the broken step occurs at one portion, it is possible to ensure the electrical connection at other portions.

Further, in the same manner as the embodiment 1, this embodiment also can enjoy an advantageous effect that even when the displacement arises with respect to the alignment of the source electrode SD2 to the semiconductor layer AS, the fluctuation of the gate-source capacitance (Cgs) is hardly generated.

Figure 16:
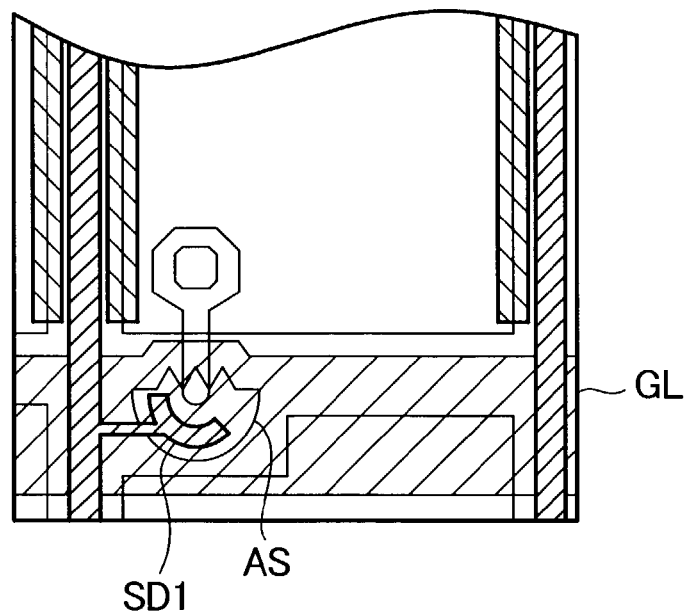
FIG. 16 is a plan view of an essential part showing another embodiment of the pixel of the liquid crystal display device according to the present invention.

Although the drain electrode SD1 is formed in a semicircular shape in this embodiment, the shape of the drain electrode SD1 is not limited to such a shape. For example, it is needless to say that, as shown in FIG. 16, the drain electrode SD1 may be formed in an arcuate shape having an opening angle of approximately 60°. This is because the opening angle of drain electrode SD1 is determined depending on the setting of a channel width of the thin film transistor TFT.

EMBODIMENT 8

Figure 17:
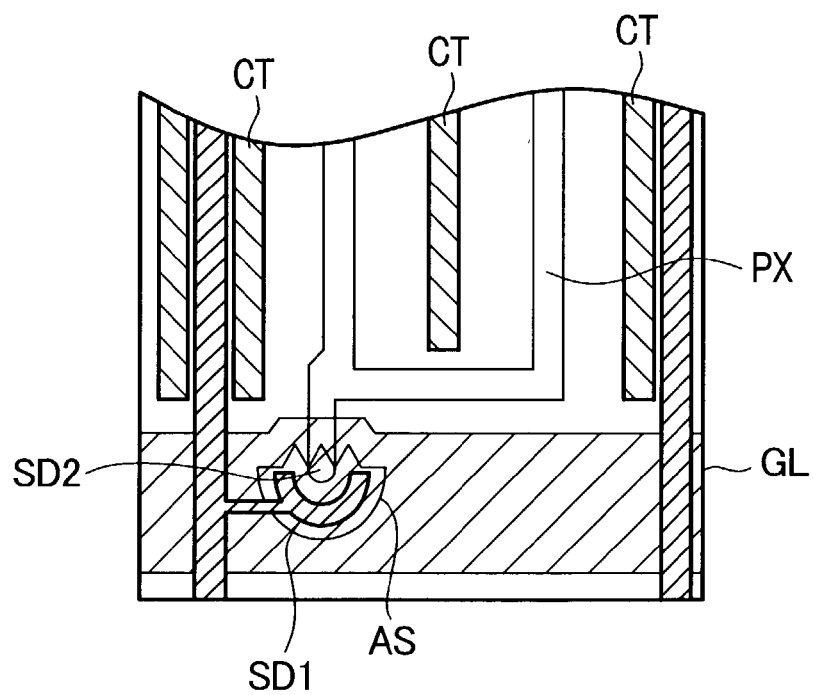
FIG. 17 is a plan view of an essential part showing another embodiment of the pixel of the liquid crystal display device according to the present invention.

FIG. 17 is a view showing the constitution of another embodiment of the liquid crystal display device according to the present invention and corresponds to FIG. 15. In FIG. 17, a region where a thin film transistor TFT is formed and portions of the liquid crystal display device in the vicinity of the region are shown.

The constitution which renders this embodiment different from the embodiment shown in FIG. 15 is that the constitution of the thin film transistor TFT as explained in conjunction with the embodiment 7 is adopted to a thin film transistor TFT of a so-called lateral electric field liquid crystal display device.

Here, in the lateral electric field liquid crystal display device, counter electrodes CT are formed on a liquid crystal side surface of a transparent substrate SUB1 together with the pixel electrode PX and these electrodes are formed in a comb-shaped pattern in which they mesh with each other.

In the liquid crystal display device having such a constitution, the liquid crystal is driven by a horizontal component of an electric field generated between the pixel electrodes PX and the counter electrodes CT so that so-called wide-viewing angle characteristics which can provide a favorable image quality even when viewed in an oblique direction are obtained.

With respect to the connection of a source electrode SD2 of the thin film transistor TFT with the pixel electrode PX, the condition is completely equal to the conditions of the embodiments which have been explained heretofore and hence, the connection which has been explained in conjunction with the previous embodiments can be directly applicable to this embodiment.

EMBODIMENT 9

Figure 18:
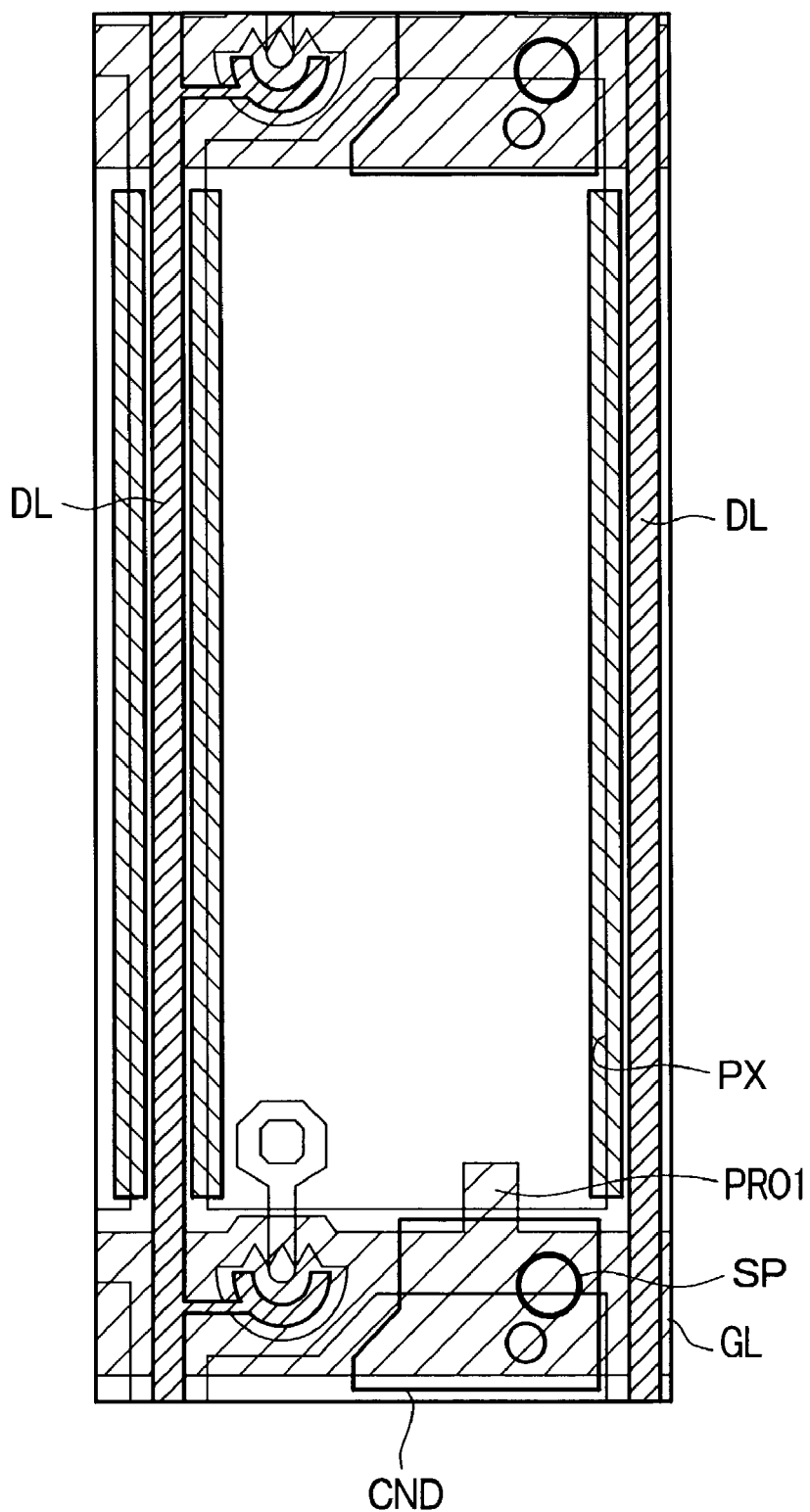
FIG. 18 is a plan view showing another embodiment of the pixel of the liquid crystal display device according to the present invention.

FIG. 18 is a view showing the construction of another embodiment of the liquid crystal display device according to the present invention and corresponds to FIG. 15.

Here, the constitution which renders this embodiment different from the embodiment shown in FIG. 15 lies in the constitution of a capacitive element Cadd.

That is, a portion of a gate signal line GL arranged in a region where the capacitive element Cadd is formed is extended toward a pixel region side so as to form a projection portion PROL and a distal end portion of the projection portion PROL is formed such that the distal end portion is superposed on the pixel electrode PX.

With respect to the thin film transistor TFT, as mentioned previously, the width of the source electrode SD2 is made relatively narrow so that the thin film transistor TFT can not ensure the gate-source capacitance (Cgs). In view of the above, this embodiment is configured to ensure the gate-source capacitance in the region where the capacitive element Cadd is formed.

In this case, with respect to capacitive elements Cadd of the respective pixel regions which use the gate signal line GL in common, by adjusting the capacitive elements Cadd such that the gate-source capacitance is sequentially changed from a small quantity to a large quantity from a scanning-signal supply end to an end opposite to the scanning-signal supply end, a drawback caused by a so-called signal jumping derived from the strain of the scanning signal can be prevented and, at the same time, the adjustment can be performed extremely easily. This is because that when the liquid crystal display device includes the thin film transistors TFT having the source electrode SD2 of a narrow width, it is difficult to adjust the gate-source capacitance of the thin film transistors TFT.

Figure 20:
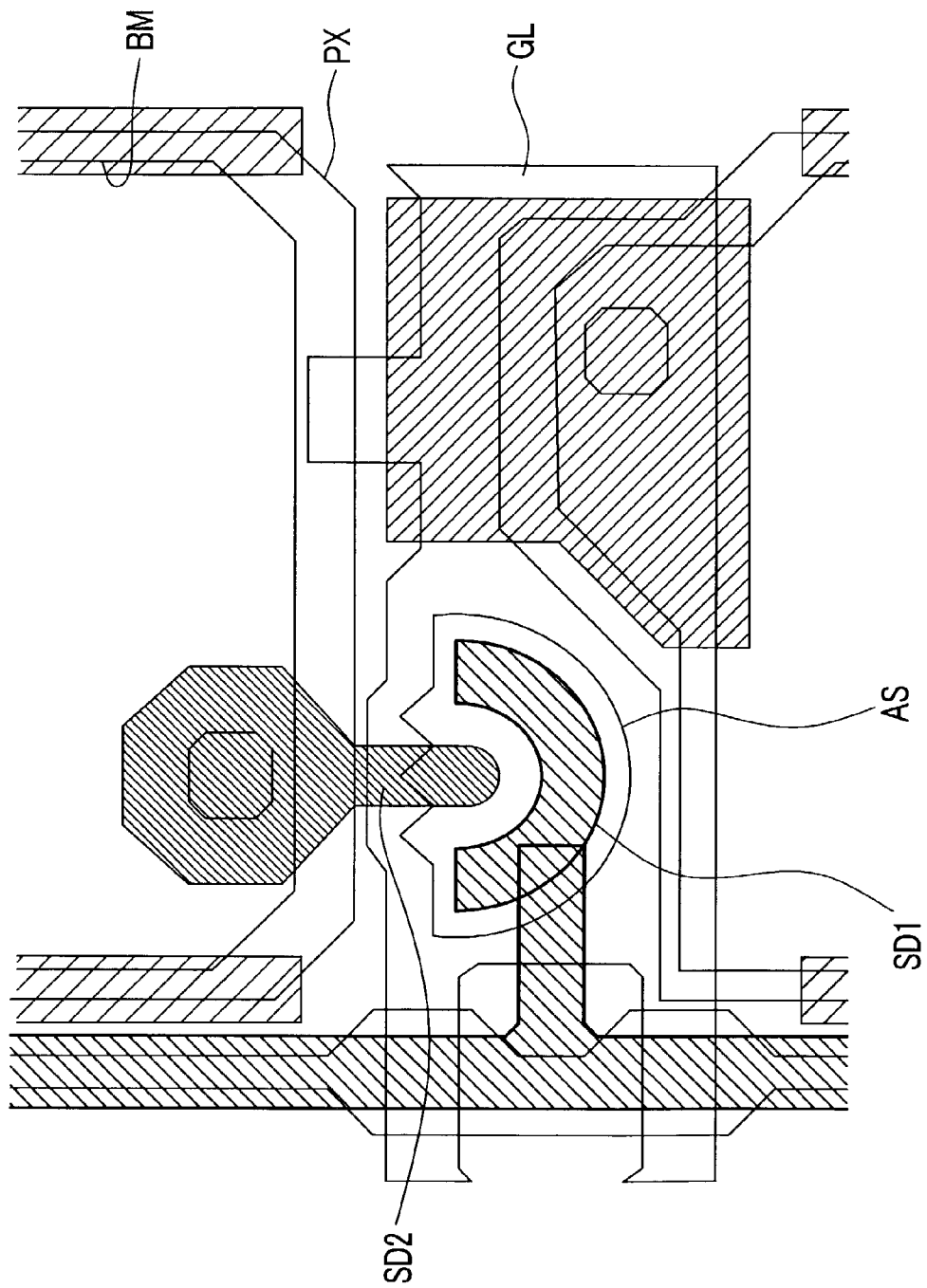
FIG. 20 is a plan view of a portion of the pixel which is prepared by considering dimensions which are determined at an actual design stage based on the constitution shown in FIG. 18.

FIG. 20 is a plan view of a portion of the pixel in this embodiment which is prepared by considering dimensions determined at an actual design stage based on the constitution shown in FIG. 18. That is, FIG. 20 shows the thin film transistor TFT, the capacitive element CAD and portions in the vicinity of these elements.

EMBODIMENT 10

Figure 19:
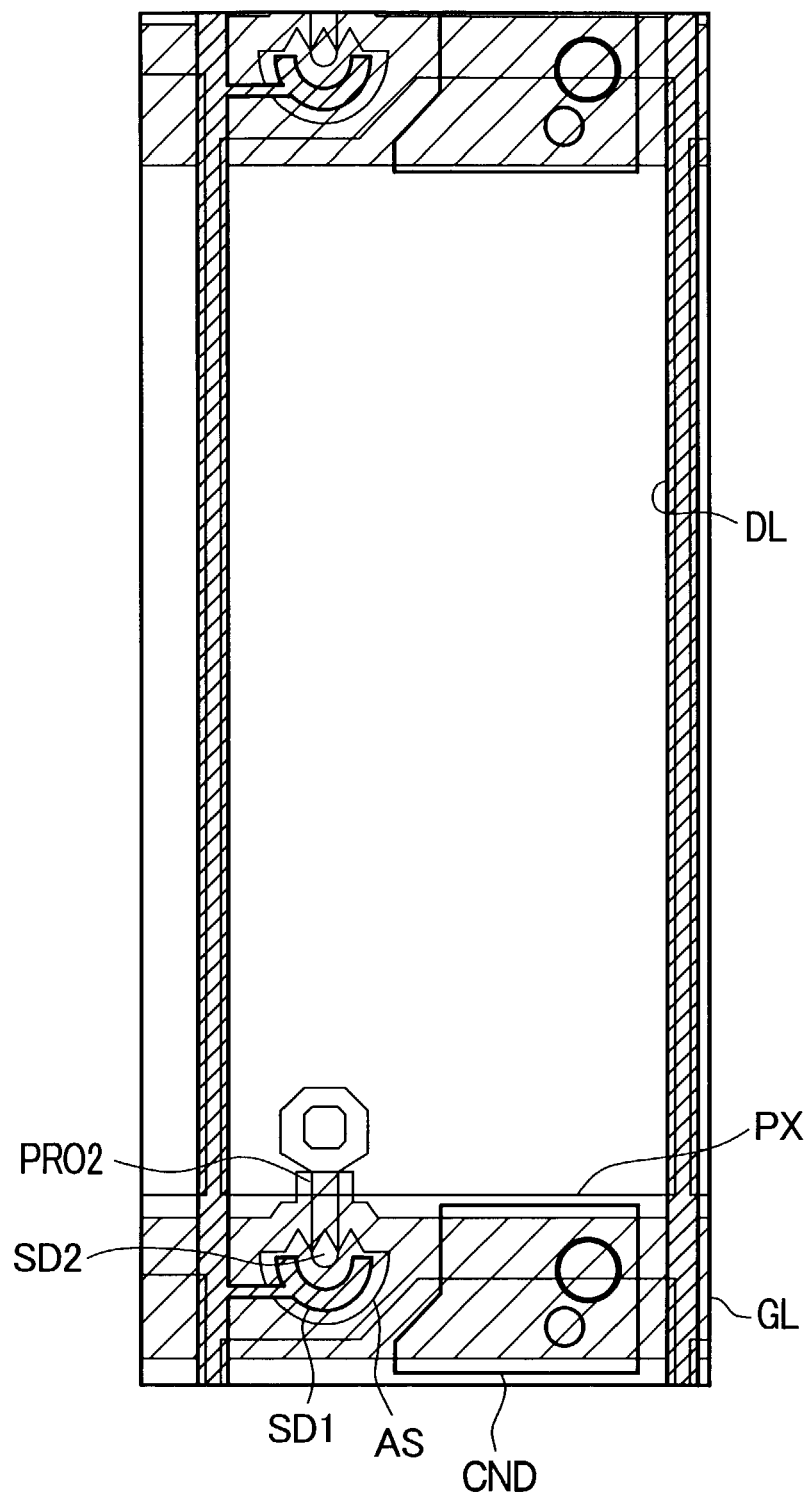
FIG. 19 is a plan view showing another embodiment of the pixel of the liquid crystal display device according to the present invention.

FIG. 19 is a view showing the constitution of another embodiment of the liquid crystal display device according to the present invention and corresponds to FIG. 15.

The constitution which renders this embodiment different from the embodiment shown in FIG. 15 lies, first of all, in that a protective film PSV is constituted of either the organic material layer alone or a sequential laminated body made of an inorganic material layer and an organic material layer.

Further, in a region where a thin film transistor TFT is formed, a portion of a gate signal line GL is extended along the longitudinal direction of a source electrode SD2 of the thin film transistor TFT thus forming a projection portion PRO2 and the projection portion PRO2 is superposed on the source electrode SD2.

That is, in view of the fact that the gate-source capacitance of the protective film is not sufficiently ensured, a region where the source electrode SD2 of the thin film transistor TFT and the gate signal line GL are superposed is increased.

Further, the adjustment of gate source capacitance of thin film transistors TFT in respective pixel regions which use the gate signal line GL in common is performed by adjusting the length of the extension portion of the gate signal line GL in the extension direction.

It is needless to say that the constitution of the thin film transistor TFT explained in conjunction with this embodiment is also applicable to the previously-mentioned lateral electric field liquid crystal display device. Further, the constitution of the thin film transistor TFT of this embodiment is also applicable to a liquid crystal display device having other constitution. Still further, the constitution of the thin film transistor TFT shown in this embodiment is also applicable to a display device using EL (Electro Luminescence) which is provided with thin film transistors TFT.

As has been explicitly explained heretofore, according to the liquid crystal display device of the present invention, a drawback caused by the displacement due to misalignment of the thin film transistor or the capacitive element can be resolved.

What is claimed is:

1. A liquid crystal display device comprising:
a pair of substrates facing each other in an opposed manner while sandwiching liquid crystal therebetween;
a plurality of gate signal lines arranged in parallel and a plurality of drain signal lines arranged in parallel while crossing the respective gate signal lines;
a plurality of pixel regions each surrounded by one of the gate signal lines and one of the drain signal lines;
a plurality of thin film transistors each driven by a scanning signal supplied from said one of the gate signal lines; and
a plurality of pixel electrodes to each of which a video signal is supplied from said one of the drain signal lines through a respective thin film transistor formed in a pixel region thereof, wherein
said respective thin film transistor includes a drain electrode connected to said one of the drain signal lines, a source electrode electrically connected to one of the pixel electrodes thorough a contact hole and spaced from said one of the drain signal lines, said source electrode is elongated in parallel with said drain signal line,
said one of the gate signal lines has a first projection portion projecting towards said one of the pixel electrodes, said first projection portion is elongated in parallel with said drain signal line and arranged between said source electrode and another drain signal line without overlapping therewith in plan view, said another drain signal line is located across said pixel electrode from said drain signal line, said first projection portion has a first overlapping region overlapping with said one of the pixel electrodes and electrically insulated from said one of the pixel electrodes, and said one of the pixel electrodes has a second projection portion projecting toward a neighboring gate signal line of said one of the gate signal lines, said second projection portion has a second overlapping region overlapping with the neighboring gate signal line of said one of the gate signal lines, the first overlapping region is separated from the source electrode without overlapping in plan view,
a conductive layer is formed on said one of the gate signal lines, a width of the conductive layer is wider than a width of said one of the gate signal lines, and the conductive layer is arranged across both sides of said one of the gate signal lines,
a columnar spacer which is arranged to overlap with the second overlapping region and the conductive layer,
the conductive layer is electrically connected with said one of the pixel electrodes through a contact hole, and
a width of the columnar spacer is wider than a width of the contact hole.

2. A liquid crystal display device according to claim 1, wherein an area of the first overlapping region is smaller than an area of the second overlapping region.

3. A liquid crystal display device according to claim 1, wherein a width of the first overlapping region is narrower than a width of the second overlapping region taken along an identical direction.

4. A liquid crystal display device according to claim 1, wherein the conductive layer overlaps with the first and second projection portions, and the second projection portion is on the neighboring gate signal line.

5. A liquid crystal, display device according to claim 2, wherein the conductive layer overlaps with the first and second projection portions, and the second projection portion is on the neighboring gate signal line.

6. A liquid crystal display device according to claim 3, wherein the conductive layer overlaps with the first and second projection portions, and the second projection portion is on the neighboring gate signal line.

* * * * *